(12) United States Patent
Johnson

(10) Patent No.: US 6,490,161 B1
(45) Date of Patent: Dec. 3, 2002

(54) PERIPHERAL LAND GRID ARRAY PACKAGE WITH IMPROVED THERMAL PERFORMANCE

(75) Inventor: Eric Arthur Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/042,500

(22) Filed: Jan. 8, 2002

(51) Int. Cl.[7] ............................................... H05K 7/20
(52) U.S. Cl. ...................... 361/704; 165/80.3; 165/185; 257/719; 257/727; 361/710; 361/717; 361/719; 439/66; 439/485; 439/487
(58) Field of Search ............................... 165/80.2, 80.3, 165/185; 174/16.3; 257/706–707, 712–713, 718–719, 726–727; 361/704–707, 709–710, 715, 717, 718, 719–720, 722; 439/66, 68–71, 485, 487

(56) References Cited

U.S. PATENT DOCUMENTS

| 5,291,062 A | 3/1994 | Higgins, III | 257/698 |
| 5,473,510 A | 12/1995 | Dozier, II | 361/719 |
| 5,619,399 A | * 4/1997 | Mok | 361/707 |
| 5,703,753 A | 12/1997 | Mok | 361/715 |
| 5,841,194 A | 11/1998 | Tsukamoto | 257/729 |
| 5,920,120 A | * 7/1999 | Webb et al. | 257/719 |
| 6,208,515 B1 | * 3/2001 | Klein | 361/704 |
| 6,222,263 B1 | 4/2001 | Sherik et al. | 257/704 |
| 6,304,450 B1 | * 10/2001 | Dibene, II et al. | 361/704 |

* cited by examiner

Primary Examiner—Gregory Thompson
(74) Attorney, Agent, or Firm—John A. Jordan; Lawrence R. Fraley

(57) ABSTRACT

A flip-chip module is interconnected to a PCB or circuit card through a peripheral LGA interposer connector. The flip-chip is mounted on the same surface of the module substrate as the peripheral array of LGA interconnection pads and projects into a central opening of the interposer. An opening in the upper stiffener of the PCB or circuit card permits the peripheral array of LGA interconnection pads to make contact with corresponding LGA PCB or circuit card pads. A first heat sink is arranged to thermally contact the entire surface of the substrate opposing the surface upon which the flip-chip is mounted. An opening in the PCB or circuit card and lower stiffener allows a second heat sink to make thermal contact with the surface of the flip-chip.

20 Claims, 4 Drawing Sheets

PERIPHERAL LAND GRID ARRAY PACKAGE WITH IMPROVED THERMAL PERFORMANCE

BACKGROUND OF THE INVENTION

1. Field of the Invention

The present invention relates to electronic packaging. More particularly, the present invention relates to electronic packaging of flip chip carriers using land grid array (LGA) interconnection techniques.

2. Background and Related Art

There exists in the prior art a variety of ways of connecting integrated circuit chips to circuit cards or printed circuit boards (PCBs). One prior art approach is to connect the integrated circuit chip directly to the laminate card or PCB. However, one of the difficulties with such connections arises from the large difference in thermal coefficient of expansion (TCE) between the silicon chip and the laminate PCB, for example. This difference creates problems affecting reliability over a large number of thermal cycles. One approach to addressing the problems caused by differences in TCE between chip and PCB is to use some form of intermediate chip carrier. Such carriers offer several advantages including the fact that they may be either single chip carriers or multichip carriers. Typically, they are made of plastic, ceramic or flexible tape-like material. However, typical chip carriers made of ceramic, for example, also have limitations in regard to overall reliability, cost and ease of assembly. Intermediate structures known as interposers, are also employed in a variety of design configurations to connect chips or chip carriers to laminate cards or PCBs. Typically, these interposers are designed to offer some additional form of compliance or compressibility in connecting chips or chip carriers to cards or PCBs so as to avoid stress, fracturing and the like caused by differences in TCE between chip or chip carrier and card or PCB. One application of interposers is in LGA interconnections between chip carrier or substrate and card or PCB. In order to ensure reliable, low electrical resistivity connections between pads on the card or PCB and pads on the substrate, the substrate LGA pads are clamped against the card or PCB LGA pads, via an electrically conductive interposer.

Since LGA interconnects rely on good surface contact between mating pads for reliable electrical connection, a constant and uniform compressive force must be maintained between the mating pads throughout the life of the electronic device in order to maintain reliable electrical interconnection. Thus, a primary requirement for LGA connectors is rigidity of the mating arrays. This requirement has led to complex and costly packaging arrangement, designed to prevent deflections of the card or PCB and components when large arrays of interconnections are employed. Typically, such arrangements have employed rigid substrates, such as a ceramic with attendant disadvantages.

Various forms of LGA interconnection structures exist in the prior art. For example, U.S. Pat. No. 5,841,194 to Tsukamoto teaches the use of peripheral stiffeners to help prevent a card or PCB deflections. Similarly, U.S. Pat. No. 5,703,753 to Mek teaches the use of peripheral contact interposer structures with a heat dissipation assembly. U.S. Pat. No. 5,473,510 to Dozier teaches structures that reduce size and complexity of apparatus used to attach LGA IC packages to PCB. However, such structures fail to provide a simple, low-cost, low-profile LGA package that provides effective heat dissipation means and, at the same time, effectively limits deflections in the PCB or circuit card and its component.

Since no solder reflow is required to make LGA interconnections, such interconnections offer an advantage when used with temperature sensitive modules, such as, some opto-electronic packages. However, such modules clearly require effective thermal dissipation during operation which has, heretofore, been difficult to achieve.

SUMMARY OF THE PRESENT INVENTION

Accordingly, it is an object of the present invention to provide an improved electronic package and method of making same.

It is a further object of the present invention to provide an improved LGA interconnection arrangement and method therefor.

It is yet a further object of the present invention to provide an improved electronic packaging arrangement and method therefor that acts to effectively dissipate heat and, at the same time, prevents deflections in the PCB or circuit card and components thereon.

It is still yet a further object of the present invention to provide an improved chip carrier cooling and interconnection method and structure for use in LGA interconnection between chip and card or PBC.

It is another object of the present invention to provide a simple, low cost LGA packaging arrangement which prevents deflections in PCB or circuit card and components and, at the same time, provides for two effective opposing heat dissipation paths.

It is yet another object of the present invention to provide an improved LGA packaging arrangement which reduces cost and complexity, improves performance and reliability and provides reduced package height.

In accordance with the present invention, a flip-chip package is interconnected to a PCB or card through a peripheral LGA interposer connector. The flip-chip is mounted below the chip carrier or substrate on the same surface as the LGA interconnection pads and projects into a central opening in the peripheral LGA interposer. An opening in the upper stiffener of the circuit card permits the LGA interposer interconnection pads to make contact with LGA circuit card pads. A primary, upper heat sink is arranged to be in thermal contact with the entire surface of the substrate. An opening provided in the PBC or circuit card and lower stiffeners allows additional heat dissipation. For example, the opening allows access for a second, lower heat sink to be thermally coupled to the chip so as to efficiently facilitate this additional heat dissipation. Alternatively, the lower stiffener may be eliminated altogether whereby the lower heat sink effectively acts as both the lower stiffener and additional heat dissipation means.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
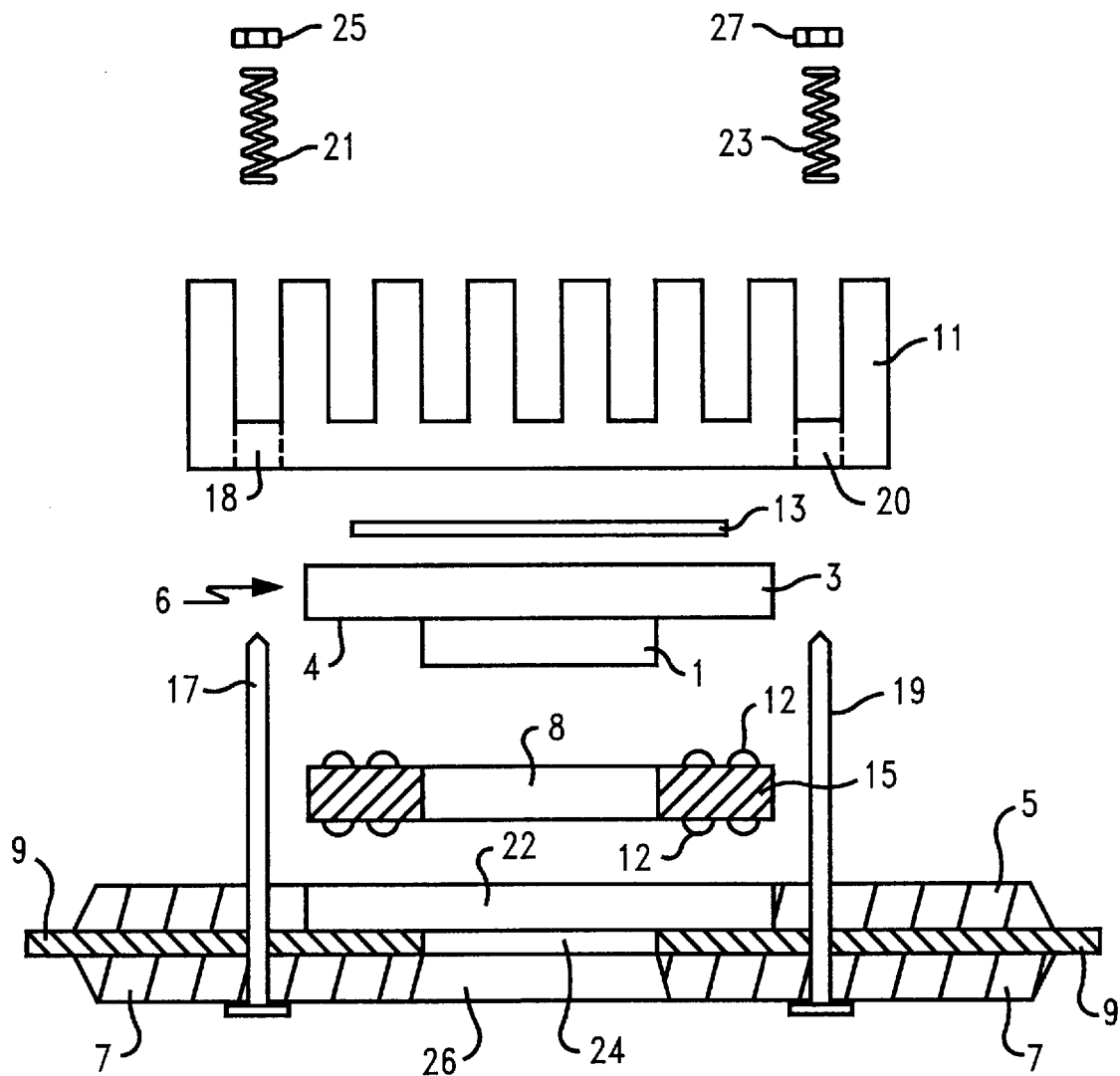
FIG. 1 shows an exploded cross-sectional view of one arrangement embodying the present invention.

With reference to FIG. 1, there is shown an exploded cross-sectional view of the flip-chip LGA interconnection arrangement, in accordance with the present invention. It should be understood that the drawings are not to scale but are merely provided to facilitate an understanding of the invention. Flip-chip 1 is shown mounted to the underside or lower surface of substrate 3 to form module 6. Typically, an array of flip-chip 1 pads (not shown) on the active surface of the chip would be connected to a matching array of pads (not shown) on substrate 3 via a full array of C4 solder ball connections (not shown). Although also not shown in FIG. 1, as is known to those skilled in the art, underfill is typically employed between chip and substrate extending out from the chip edges, as shown by reference numeral 10 in FIG. 4.

Figure 3:
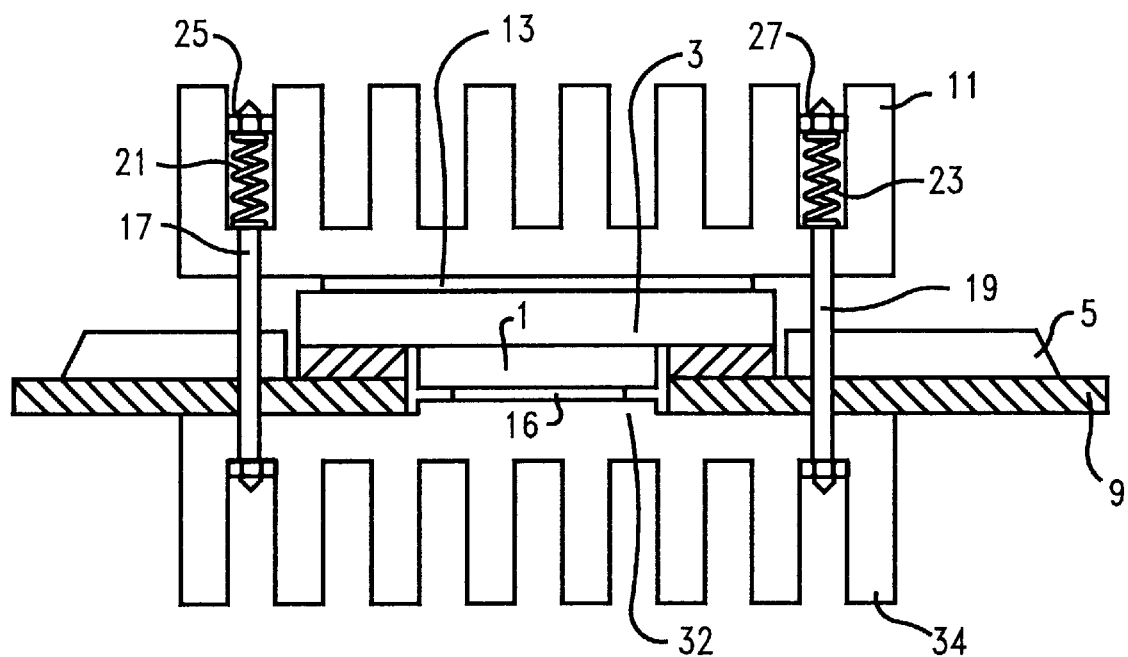
FIG. 3 shows a cross-sectional view of a further arrangement embodying the present invention.

The array of pads on substrate 3 that connect by C-4 solder balls to the chip also connect, by metallurgy, to I/O LGA pads (not shown) around the periphery of the lower surface 4 of substrate 3. The pattern of peripheral I/O pads on substrate 3 of module 6 match the pattern of pads (not shown) on the upper surface of circuit card 9. It is clear that circuit card 9 could just as well be a PCB or other type of module substrate. Stiffeners 5 and 7 are mechanically attached to circuit card 9 by any of a variety of techniques, such as, by employing a bonding agent. As is understood by those skilled in the art, LGA type interconnections require a clamping or loading force to clamp the connection pads on the substrate to the corresponding pads on the circuit card to which the substrate is to be attached. Stiffeners 5 and 7 are provided, as shown in FIG. 1, to prevent the deflection or bending of circuit card 9 when a clamping force is applied. However, as will be explained more fully hereinafter, one or both stiffeners may, in accordance with the present invention, be unnecessary depending upon the particular application. For example, FIG. 3 shows one arrangement where stiffener 7 has been eliminated. In this regard, one effective method of mechanically attaching stiffeners to the circuit card is by transfer molding the stiffeners directly onto the circuit card. This provides a simple, low cost approach to stiffening the circuit card. Preferably, such stiffeners would be made of a filled epoxy. However, it is important to choose a mold compound with a CTE similar to that of the circuit card in order to minimize warping and internal stresses. It is also preferred to use a symmetric cross-section in order to minimize warping caused by cure shrinkage. Thus, similar thicknesses and area coverage should be used for the stiffening layers on opposing surfaces of the circuit card.

Figure 4A:
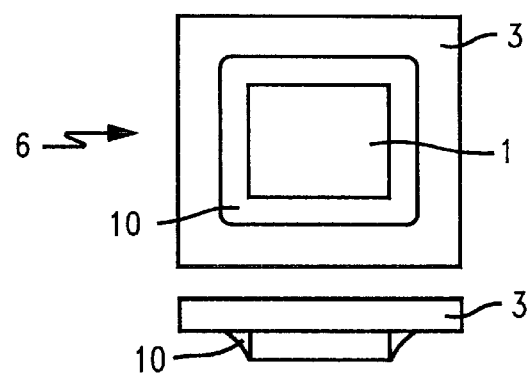
FIGS. 4A and 4B respectively show bottom views of the module and LGA interposer, in accordance with the present invention.
Figure 4B:
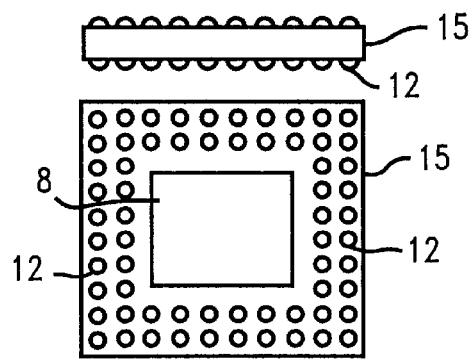

In accordance with the present invention, the peripheral I/O LGA pads on substrate 3 of module 6 are connected to the matching array of LGA pads on circuit card 9 by peripheral LGA interposer 15. The interposer is typically made of flexible material with an opening 8 in the central region and hosts a peripheral array of conductive through-pins 12, with the conductive through-pins having a pattern matching the pattern of the peripheral I/O LGA pads on substrate 3 and corresponding peripheral array of LGA pads on circuit card 9. As can be seen, the size of the pins 12 has been somewhat exaggerated in this Figure. The complete interposer can be seen more clearly in the bottom view shown in FIG. 4B. As can be seen, FIG. 4B shows a side view of interposer 15 aligned with the bottom view, the latter showing the opening 8 in the central region thereof. Similarly, FIG. 4A shows a side view of module 6, comprising chip 1 and substrate 3, aligned with a bottom view.

It should be noted that the chip-substrate module 6 is arranged in a configuration that is inverted from that typically employed. Such an arrangement has several advantages. It allows the chip to be positioned in the opening 8 of interposer 15 thus lowering the height of the assembly. In addition, since such an arrangement puts the rigid, flat surface of heat sink 11 in contact with substrate 3 rather than chip 1, as is conventionally the case, the need for a rigid substrate, such as ceramic, is obviated. This reduces cost and, with selected organic substrate material, permits lowering the dielectric constant.

As shown in FIG. 1, opening 8 in interposer 15 is sufficient in size to accommodate chip 1. Preferably, the opening is slightly larger than the chip. Similarly, opening 22 in stiffener 5 is sufficient in size to accommodate interposer 15 and, preferably, is slightly larger than interposer 15.

It should also be noted, that with conventional LGA arrangements, a clamping force is typically applied by the heat sink only to the top surface of the chip while the reaction force is spread over the entire array of I/O contacts. Consequently both the substrate and card must be rigid to prevent excessive bending of the substrate beyond the chip's periphery that may reduce contact force in some areas. With the arrangement shown in FIG. 1, when the clamping force is applied to cause the respective peripheral LGA I/O pads on substrate 3 to compress against the corresponding LGA pads on card 9 through the respective conductive pins 12, the force applied by heat sink 11 is spread over the entire surface of substrate 3 and the reaction force is spread over the peripheral array of LGA I/O pads on this same substrate 3. With such an arrangement, the stiffness of the heat sink substantially reduces substrate bending. Not only is substrate bending substantially reduced, but this arrangement makes possible the use of low cost, low-dielectric, organic substrates. In this regard, thermal conductivity through the thickness of such an organic material used for substrate 3 may be improved if thermal vias are used. Typically, such organic material may, for example, be PTFE and PTFE composites, epoxy-glass composites, liquid crystal polymers or the like.

Again, with reference to FIG. 1, heat sink 11 typically is made of a rigid, high thermal conductivity material such as copper or aluminum. Heat sink 11 is positioned to contact substrate 3 through flexible thermal conductor 13, such as a thermally conductive silicone pad. Clamping heat sink 11 to circuit card 9 is achieved by aligning holes 18 and 20 in the heat sink with pins 17 and 19 and causing retainers 25 and 27 to compress springs 21 and 23 onto the pins. In the arrangement of FIG. 1, respective openings 24 and 26 in circuit card 9 and stiffener 7 act to allow additional cooling by convection or, alternatively, may be used to facilitate thermal conduction through an additional heat sink.

Figure 2:
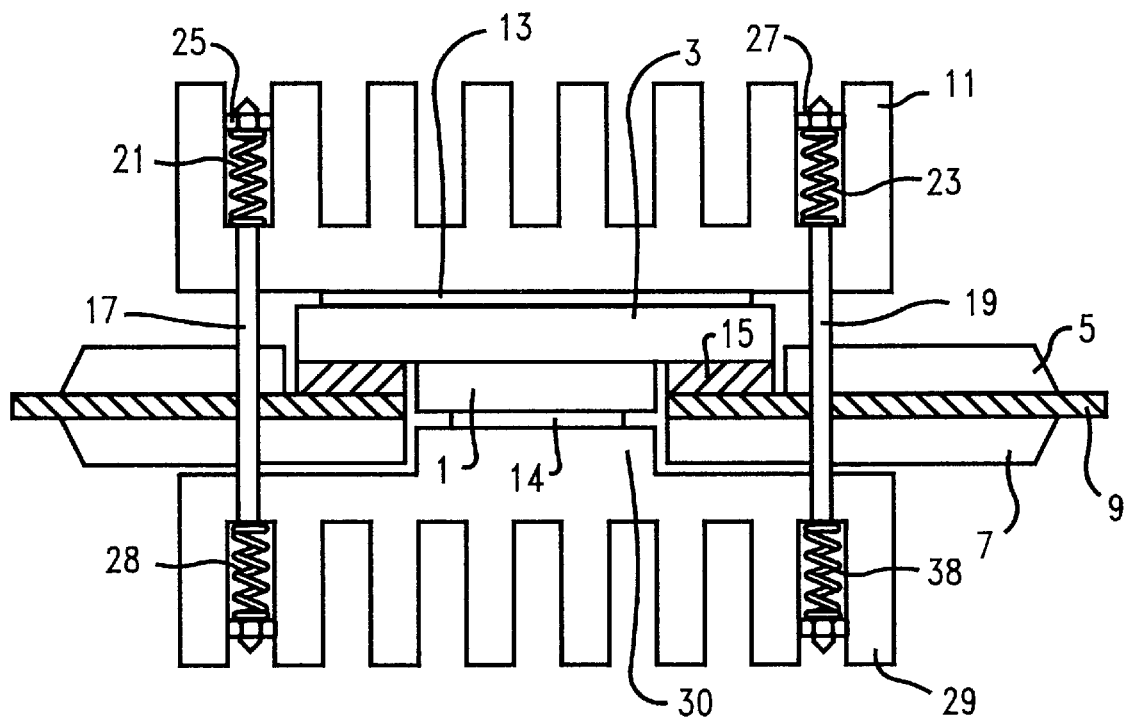
FIG. 2 shows a cross-sectional view of another arrangement embodying the present invention.
Figure 5A:
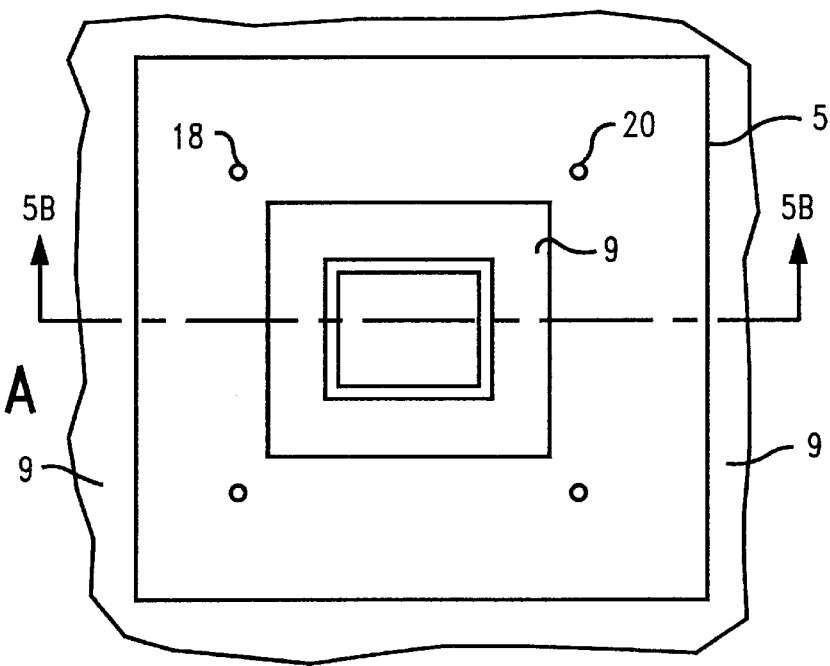
FIGS. 5A and 5B respectively show a top view and cross-sectional view of the circuit card with upper and lower stiffeners, in accordance with the present invention.
Figure 5B:
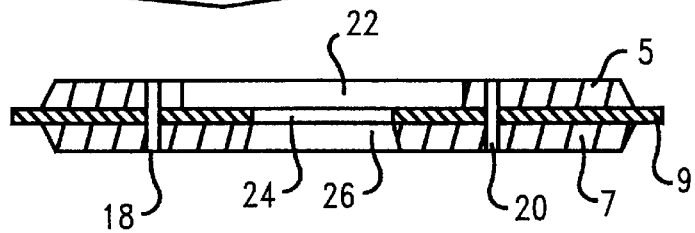

FIG. 2 shows a cross-sectional view of the arrangement of FIG. 1 with a second heat sink 29 in thermal contact with chip 1. This arrangement is best carried out by providing openings in both circuit card 9 and lower stiffener 7 of sufficient size to allow full access to the total inactive, lower surface of chip 1. In this regard, it should be noted that interposer 15 in FIG. 1 may be designed to exhibit an overall height or thickness slightly larger than the thickness of chip 1 where openings in circuit card 9 and stiffener 7 are not provided or are not sufficiently large to accommodate chip 1. Alternatively, in FIG. 2, the interposer 15 may be designed to exhibit an overall height or thickness less than chip 1 thus allowing the chip to extend into the opening in circuit card 9, as shown. As can be seen, the contact surface of heat sink 29 in FIG. 2 is shaped to provide a protruding region 30 which fits into the opening in lower stiffener 7. As can be also seen, the openings for chip 1 and protruding region 30 are slightly larger than the chip and protruding region themselves. FIGS. 5A and 5B respectively show a top view and cross-sectional view of stiffeners and circuit card 9 with corresponding openings. While holes 18 and 20, shown in FIGS. 5A and 5B, for the guide pins 17 and 19, (shown in FIG. 1) are depicted as being outside the peripheral LGA pad region of interposer 15, it is clear that all four holes, as shown in FIG. 5A, could also be positioned within this region.

Again, with reference to FIG. 2, the protruding region 30 of heat sink 29 is in contact with the inactive surface of chip 1 through thermally conductive layer 14. Since, as shown, there is some clearance provided between the surface of heat sink 29 and stiffener 7, the thickness of this thermally conductive layer can be minimized. Such an arrangement provides an effective thermal approach to heat dissipation. As shown, springs 28 and 38, with retainers, are used to clamp heat sink 29 in place.

Alternatively, FIG. 3 shows a lower heat sink arrangement in direct contact with circuit card 9. In this arrangement, by elimination of the lower stiffener and by directly contacting circuit card 9 with the peripheral surface of heat sink 34, the heat sink effectively becomes the stiffener to maintain bending within required limits. Although this approach reduces cost, thermally conductive layer 16 between protruding region 32 and chip 1 must be sufficiently thick to accommodate the tolerance build-up from the chip to the heat sink through the chip, C4 connections, interposer and card. For this reason, the use of a layer of thermal grease for thermally conductive layer may be preferred. It should be noted that the extent of the protrusion of protruding region 32 of heat sink 34 is less than that of protruding region 30 of heat sink 29 due to elimination of stiffener 7. Although not shown, it is possible to eliminate both stiffeners in the arrangement of FIG. 3 such that the rigid, flat contact surfaces of heat sink 34 effectively acts to provide the stiffening for both stiffeners.

Figure 6:
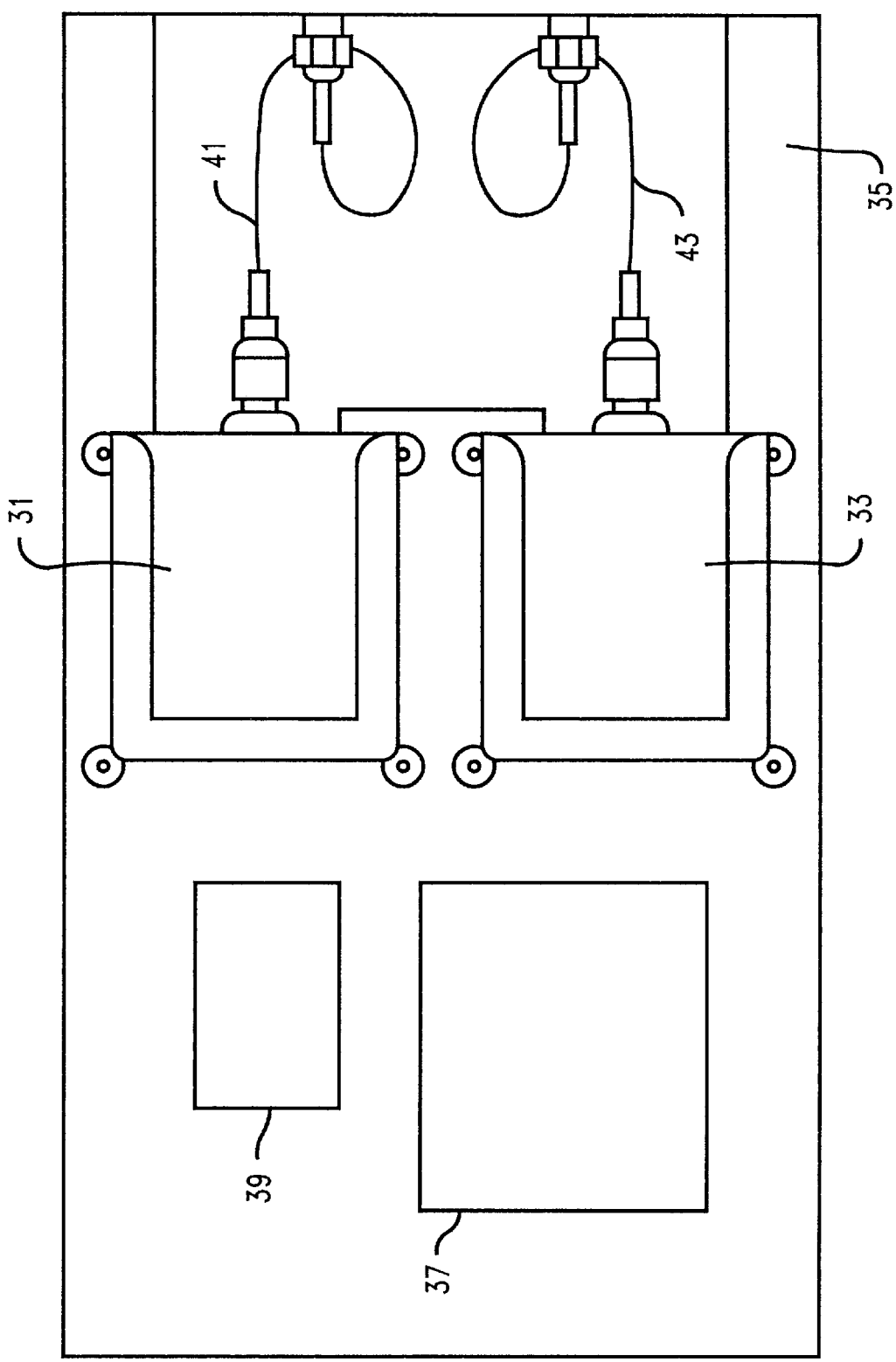
FIG. 6 shows a top view of an opto-electronic card application of the LGA interconnection arrangement, in accordance with the present invention.

It should be understood that the peripheral array of LGA pads on interposer 15 need not completely surround the chip. FIG. 6 shows an application where the array of LGA pads extend around three sides of modules 31 and 33. The fourth side of the modules is used to interface with connectors to optical fibers 41 and 43. A variety of other modules or components such as modules or components 37 and 39, may also be provided on card 35, the latter of which modules or components could employ peripheral LGA pads on all sides of an interposer, as shown in the previous Figures. Such an arrangement provides a low-profile, reworkable package for fiber-optic transceivers.

Accordingly, there is provided, in accordance with the present invention, a simple, low-cost, low-profile reworkable LGA package arranged to provide minimal bending of circuit card and components with improved means to dissipate heat from the chip. Although, reference has been made herein to a single chip module, it is clear that a multiple chip module (MCM) could, likewise, be used.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. An electronic assembly, comprising:
   at least one chip having an array of contacts;
   a first substrate having a first array of contacts on one surface thereof connected to said array of contacts of said at least one chip and a second array of peripheral contacts on said one surface of said first substrate, said second array of peripheral contacts connected through said first substrate to said first array of contacts; and
   an interposer layer of insulating material having a peripheral array of interconnection conductors presented on one surface matching said second array of peripheral contacts on said first substrate and conductively extending through said interposer layer presented to the other surface thereof, said interposer having an opening in the central region thereof to accommodate said chip and allow said peripheral array of interconnection conductors to respectively contact said second peripheral array of contacts on said first substrate;
   a second substrate having a peripheral array of contacts on one surface in contact with said interconnection conductors of said interposer layer presented to said other surface; and
   heat dissipating means extending through the central portion of said second substrate to said at least one chip.

2. The electronic assembly as set forth in claim 1 wherein a first heat sink is in thermal contact with the surface of said substrate opposing the surface with said first and second array of contacts.

3. The electronic assembly as set forth in claim 2 wherein said second substrate has a first stiffening layer attached to the said one surface thereof with an opening through the central portion thereof sufficient in size to accommodate said interposer layer.

4. The electronic assembly as set forth in claim 3 wherein said heat dissipating means is a second heat sink having a contact region extending through the said central portion of said second substrate to make thermal contact with said at least one chip.

5. The electronic assembly as set forth in claim 4 wherein the surface of said second heat sink extends outwardly from said contact region and is in contact with the other surface of said second substrate so as to provide a support and stiffening surface therefor.

6. The electronic assembly as set forth in claim 5 wherein a second stiffening layer is mechanically attached to the said other surface of said second substrate between the said other surface and the said surface of said second heat sink with said second stiffening layer having an opening through the central portion thereof to allow thermal contact between said contact region of said second heat sink and said at least one chip.

7. The assembly as set forth in claim 6 wherein said first and second stiffening layers are transfer molded directly onto said second substrate.

8. The assembly as set forth in claim 6 wherein said first substrate is made of an organic material.

9. The assembly as set forth in claim 7 wherein said peripheral array of contacts on said first and second substrates are LGA contacts.

10. The electronic assembly as set forth in claim 9 wherein said first substrate comprises a multiple chip module.

11. An electronic assembly, comprising:

an electronic module having at least one chip on one surface, having its input/output contacts electrically connected to a plurality of peripheral contacts on the outer portion of said one surface;

an interposer layer having an opening in a central portion thereof sufficient in size to accommodate said at least one chip and having a peripheral array of interconnection conductors extending from one surface to the other with said conductors extending from said one surface in electrical contact with said plurality of peripheral contacts on said one surface of said electronic module;

a substrate for said module having first and second surfaces and an opening in a central portion thereof and a peripheral array of contacts on said first surface around said opening in electrical contact with said peripheral array of interconnection conductors extending to the said other surface of said interposer;

a first heat sink in thermal contact with the other surface of said electronic module; and a second heat sink extending through the said opening in said central portion of said substrate and in thermal contact with said at least one chip.

12. The electronic assembly as set forth in claim 11 wherein said substrate has a first stiffening layer attached to said first surface with an opening therein sufficient in size to accommodate said interposer layer.

13. The electronic assembly as set forth in claim 12 wherein the said second heat sink extending through the said opening in said central portion of said substrate and in thermal contact with said at least one chip has a surface extending beyond the said opening of said substrate in contact with the said second surface of said substrate to prevent bending of said substrate upon application of a loading force.

14. An electronic assembly as set forth in claim 13 wherein a second stiffening layer is attached to the said second surface of said substrate around the said opening in said substrate.

15. An electronic assembly as set forth in claim 14 wherein said loading force is applied across said first and second heat sinks.

16. A method of dissipating heat and inhibiting substrate bending in an electronic module; comprising:

connecting an array of contacts on one surface of a first substrate to a peripheral array of contacts on said one surface;

electronically connecting the active surface of at least one chip to said array of contacts on said one surface of a first substrate;

forming an interposer layer structure with an opening in the central region thereof sufficient in size to accommodate said at least one chip and an a peripheral array of contacts matching said peripheral array of contacts on said first substrate and extending from one surface of said interposer layer structure to the other;

positioning said first substrate so that said peripheral array of contacts on said one surface of said first substrate are in contact with said peripheral array of contacts of said interposer layer structure extending from said one surface with said at least one chip suspended in the said opening in said central region of said interposer layer structure;

forming a second substrate with an opening in the central portion thereof and a peripheral array of contacts on a first surface thereof matching the peripheral array of contacts on said interposer layer structure extending to the said other surface;

positioning said interposer layer structure so that the said peripheral array of contacts of said interposer layer structure extending to said other surface are in contact with the peripheral array of contacts on said first surface of a second substrate; and applying a heat dissipating structure in thermally conductive contact with the other surface of said first substrate.

17. The method as said forth in claim 16 wherein, a further heat dissipating structure is applied in thermally conductive contact with said at least one chip through said opening in said central portion of said second substrate.

18. The method as set forth in claim 17 wherein, said further heat dissipating structure has a rigid surface region that extends beyond said opening in said central portion of said second substrate with said rigid surface region being compressed against a second surface of said second substrate to inhibit bending due to loading force.

19. The method as set forth in claim 18, further including the steps of initially transfer molding a layer of stiffening material to said first surface of said second substrate and forming an opening therein sufficient in size to accommodate said interposer layer structure.

20. The method as set forth in claim 19, further including the steps of initially transfer molding a layer of stiffening material to said second surface of said second substrate and forming an opening therein connecting to the said opening in said second substrate.

\* \* \* \* \*